(12) United States Patent
Kumazaki

(10) Patent No.: US 7,920,439 B2
(45) Date of Patent: *Apr. 5, 2011

(54) SEMICONDUCTOR MEMORY DEVICE USING A BANDGAP REFERENCE CIRCUIT AND A REFERENCE VOLTAGE GENERATOR FOR OPERATING UNDER A LOW POWER SUPPLY VOLTAGE

(75) Inventor: Noriyasu Kumazaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 380 days.

This patent is subject to a terminal disclaimer.

(21) Appl. No.: 11/860,779

(22) Filed: Sep. 25, 2007

(65) Prior Publication Data

US 2008/0239837 A1 Oct. 2, 2008

(30) Foreign Application Priority Data

Sep. 26, 2006 (JP) ................. 2006-261024

(51) Int. Cl.
*G11C 5/14* (2006.01)
*G05F 3/08* (2006.01)

(52) U.S. Cl. ... 365/227; 365/228; 365/226; 365/189.09; 365/189.11; 327/539; 327/538; 323/313

(58) Field of Classification Search .................. 365/229, 365/228, 227, 226, 189.09, 189.11; 327/539, 327/538; 323/313
See application file for complete search history.

(56) References Cited

U.S. PATENT DOCUMENTS

| 5,303,189 | A | * | 4/1994 | Devin et al. | 365/185.18 |
| 5,940,322 | A | * | 8/1999 | Atsumi | 365/185.18 |
| 5,986,941 | A | * | 11/1999 | Pang et al. | 365/185.33 |
| 6,160,391 | A | | 12/2000 | Banba | |
| 2009/0108919 | A1 | * | 4/2009 | Ogiwara et al. | 327/539 |

FOREIGN PATENT DOCUMENTS

| JP | 9-69014 | 3/1997 |
| JP | 11-45125 | 2/1999 |
| WO | WO 98/58382 | 12/1998 |

* cited by examiner

*Primary Examiner* — Andrew Q Tran
(74) *Attorney, Agent, or Firm* — Oblon, Spivak, McClelland, Maier & Neustadt, L.L.P.

(57) ABSTRACT

A semiconductor memory device includes a boosting power supply circuit that boosts a first voltage to a second voltage, which is higher than an external power supply. A first bandgap reference (BGR) circuit operates on the second voltage generated by the boosting power supply circuit. Thereby, the power supply circuit generates a voltage by using a bandgap reference circuit.

10 Claims, 8 Drawing Sheets

US 7,920,439 B2

SEMICONDUCTOR MEMORY DEVICE USING A BANDGAP REFERENCE CIRCUIT AND A REFERENCE VOLTAGE GENERATOR FOR OPERATING UNDER A LOW POWER SUPPLY VOLTAGE

CROSS-REFERENCE TO RELATED APPLICATIONS

This application is based upon and claims the benefit of priority from prior Japanese Patent Application No. 2006-261024, filed Sep. 26, 2006, the entire contents of which are incorporated herein by reference.

BACKGROUND OF THE INVENTION

1. Field of the Invention

The present invention relates to a semiconductor device. For example, the present invention relates to the arrangement of a power supply circuit that generates a voltage by using a bandgap reference circuit in a semiconductor memory device.

2. Description of the Related Art

A bandgap reference circuit is conventionally used as a voltage generator that generates a constant voltage. The bandgap reference circuit generates a physically constant voltage of about 1.25 V regardless of the temperature and the like.

Unfortunately, the conventional bandgap reference circuit has the problem that a normal operation becomes difficult to perform if the power supply voltage drops. If the power supply voltage, for example, becomes 1 V lower than 1.25 V, the bandgap reference circuit cannot generate 1.25 V, or becomes entirely inoperable.

Accordingly, a bandgap reference circuit having a variable output voltage is known (e.g., Jpn. Pat. Appln. KOKAI Publication No. 11-45125, to be referred to as a level variable bandgap reference circuit hereinafter). This arrangement can stably produce a voltage corresponding to the power supply voltage even if the power supply voltage drops. However, this circuit also has the problems that the circuit configuration is complicated, and the variation in output voltage is large.

BRIEF SUMMARY OF THE INVENTION

A semiconductor device according to an aspect of the present invention comprising a boosting circuit which boosts in a second voltage higher than an external power supply by using a first voltage as a reference voltage, and a bandgap reference circuit which operates by using the second voltage generated by the boosting circuit as a power supply voltage.

DETAILED DESCRIPTION OF THE INVENTION

Figure 1:
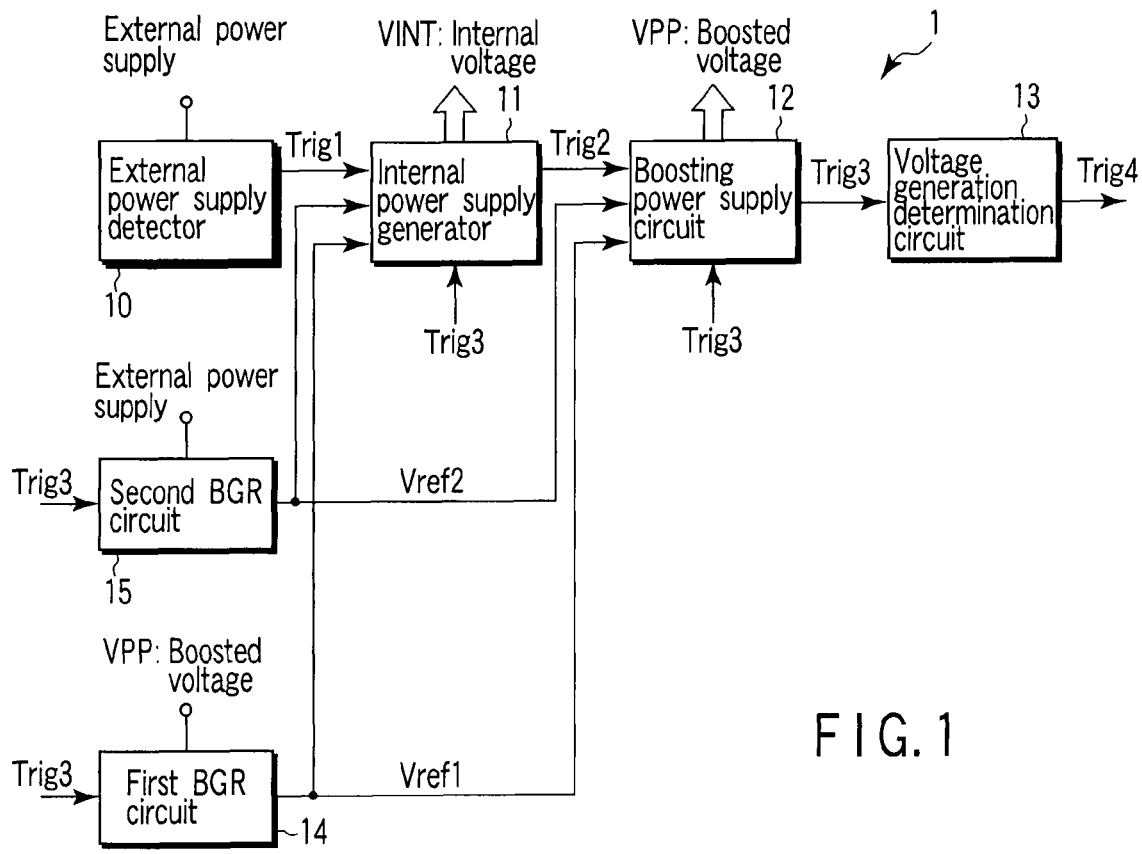
FIG. 1 is a block diagram of a semiconductor device according to the first embodiment of the present invention.

Embodiments of the present invention will be explained below with reference to the accompanying drawing. In the following explanation, the same reference numerals denote the same parts throughout the drawing.

First Embodiment

A semiconductor device according to the first embodiment of the present invention will be explained below with reference to FIG. 1. FIG. 1 is a block diagram of the semiconductor device according to this embodiment.

As shown in FIG. 1, a semiconductor device 1 comprises an external power supply detector 10, internal power supply generator 11, boosting power supply circuit 12, voltage generation determination circuit 13, first bandgap reference circuit 14, and second bandgap reference circuit 15. The first and second bandgap reference circuits 14 and 15 will be referred to as first and second BGR circuits 14 and 15 hereinafter.

The external power supply detector 10 detects an external power supply provided from outside the semiconductor device 1, and outputs a signal Trig1 when detecting the external power supply.

The first BGR circuit 14 operates by using a boosted voltage VPP generated by the boosting power supply circuit 12 as the power supply voltage, and generates a reference voltage Vref1. Details of the first BGR circuit 14 will be described later.

The second BGR circuit 15 operates by using the external power supply as a power supply voltage, and generates a reference voltage Vref2 when the external power supply is turned on. Details of the second BGR circuit 15 will be described later.

The internal power supply generator 11 starts operating in response to signal Trig1, and generates an internal voltage VINT by referring to reference voltage Vref1 or Vref2. The internal power supply generator 11 also generates a signal Trig2 when the generated internal voltage VINT has reached a predetermined value. Note that in this specification, "referring" in the expression "generates a voltage by referring to" does not mean that the voltage (e.g., reference voltage Vref1 or Vref2) to be referred to is used as the power supply voltage. That is, "referring" means that a voltage to be referred to is used as a reference voltage of a desired voltage in order to obtain the desired voltage by increasing the reference voltage by a predetermined number of times.

The boosting power supply circuit 12 starts operating in response to signal Trig2, and generates the boosted voltage VPP by referring to reference voltage Vref1 or Vref2. The boosting power supply circuit 12 also generates a signal Trig3 when the generated boosted voltage VPP has reached a predetermined value.

Signal Trig3 functions as a signal that controls the self operations of the internal power supply generator 11, first and second BGR circuits 14 and 15, and boosting power supply circuit 12. That is, when signal Trig3 is output, the internal power supply generator 11 and boosting power supply circuit 12 switch the reference voltage to be used from Vref2 to Vref1. In addition, when signal Trig3 is generated, the first BGR circuit 14 starts operating, and the second BGR circuit 15 stops operating.

The voltage generation determination circuit 13 detects signal Trig 3 and reference voltage Vref1, and generates a signal Trig4.

Figure 2:
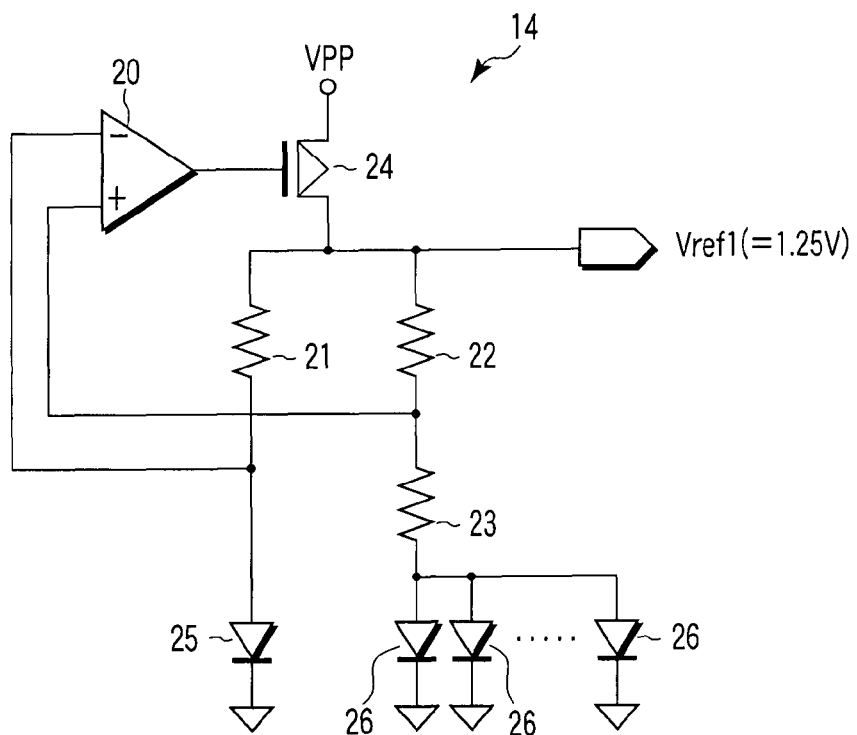
FIG. 2 is a circuit diagram of a first BGR circuit of the semiconductor device according to the first embodiment of the present invention.

The arrangement of the first BGR circuit 14 will be explained below with reference to FIG. 2. FIG. 2 is a circuit diagram of the first BGR circuit 14. As shown in FIG. 2, the first BGR circuit 14 comprises an operational amplifier 20, resistance elements 21 to 23, a p-channel MOS transistor 24, a diode 25, and N diodes 26. The number of the diodes 26 is, e.g., 100 (N=100).

The MOS transistor 24 has a gate connected to the output terminal of the operational amplifier 20, and a source that receives the boosted voltage VPP output from the boosting power supply circuit 12. The resistance element 21 has one terminal connected to the drain of the MOS transistor 24, and the other terminal connected to the anode of the diode 25. The cathode of the diode 25 is grounded. The resistance element 22 has one terminal connected to the drain of the MOS transistor 24, and the other terminal connected to one terminal of the resistance element 23. The other terminal of the resistance element 23 is connected to the anodes of the N diodes 26. The cathodes of the diodes 26 are grounded. A connection node between the other terminal of the resistance element 21 and the anode of the diode 25 is connected to the inverting input terminal (−) of the operational amplifier 20. A connection node between the other terminal of the resistance element 22 and one terminal of the resistance element 23 is connected to the positive input terminal (+) of the operational amplifier 20. The voltage at a connection node between the drain of the MOS transistor 24 and one terminal of each of the resistance elements 21 and 22 is output as the output voltage Vref1 of the first BGR circuit 14.

In the above arrangement, the first BGR circuit 14 operates by using the boosted voltage VPP as the power supply voltage (the source voltage of the MOS transistor 24), and outputs reference voltage Vref1. Also, the first BGR circuit 14 operates in response to signal Trig3 output from the boosting power supply circuit 12. That is, when signal Trig3 is generated, the first BGR circuit 14 receives the signal and starts operating. More specifically, the boosted voltage VPP is applied to the first BGR circuit 14 when signal Trig 3 is asserted (e.g., high), and the application of the boosted voltage VPP stops when signal Trig3 is negated (low).

Letting R1 to R3 be the resistances of the resistance elements 21 to 23 and Vf1 be the voltage drop in the diode 25, reference voltage Vref1 output from the first BGR circuit 14 is represented by $$V\text{ref}1 = Vf1 + (R2/R3) \cdot VT \cdot \ln(N \cdot R2/R1) \tag{1}$$

where VT is the thermoelectromotive force of the diode and VT=kT/q where k is Boltzmann's constant, T is the absolute temperature, and q is the electric charge amount of an electron. The above equation shows that the temperature characteristic of Vref1 (the degree of change in Vref1 with respect to the temperature: dVref1/dT) can be changed by appropriately selecting the resistances R1 to R3 of the resistance elements 21 to 23. However, the value of Vref1 itself is almost constant at about 1.25 V. This value of 1.25 V is physically determined in the first BGR circuit 14 in the state in which Vref1 remains unchanged with respect to the temperature (dVref1/dT=0), and cannot be changed. In other words, the first BGR circuit 14 can function as a power supply that is fixed to 1.25 V and stable with respect to the temperature by selecting the resistances R1 to R3.

Figure 3:
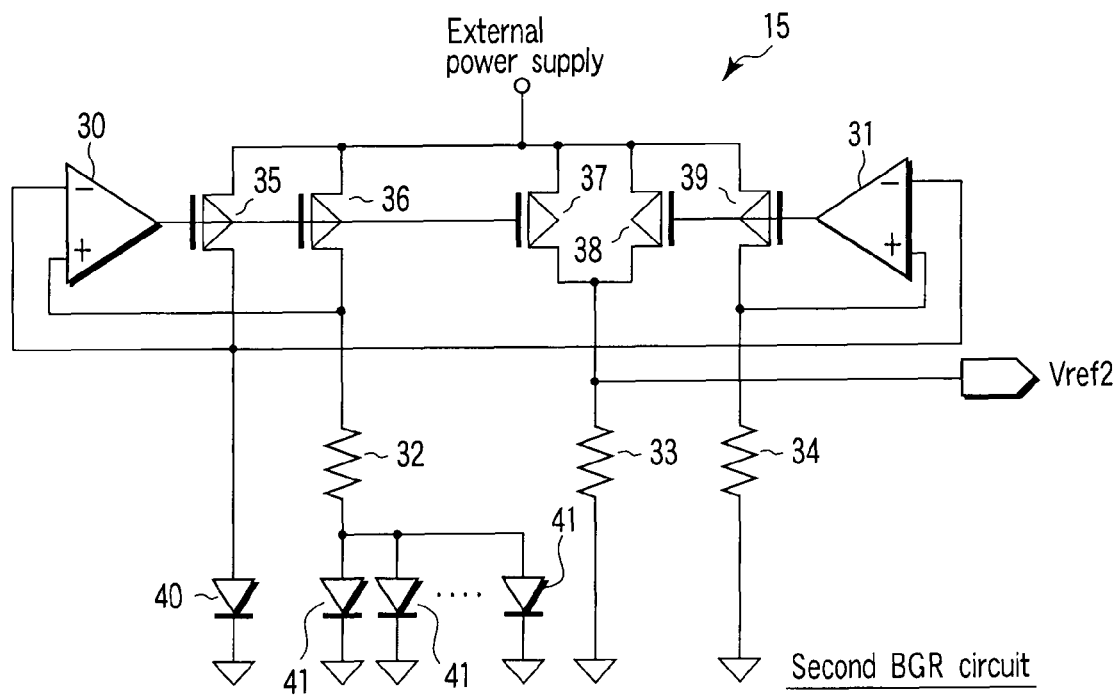
FIG. 3 is a circuit diagram of a second BGR circuit of the semiconductor device according to the first embodiment of the present invention.

Next, the arrangement of the second BGR circuit 15 will be explained below with reference to FIG. 3. FIG. 3 is a circuit diagram of the second BGR circuit 15. As shown in FIG. 3, the second BGR circuit 15 comprises operational amplifiers 30 and 31, resistance elements 32 to 34, p-channel MOS transistors 35 to 39, a diode 40, and N diodes 41. The number of the diodes 41 is, e.g., 100 (N=100).

The MOS transistor 35 has a gate connected to the output terminal of the operational amplifier 30, and a source connected to an external power supply. The diode 40 has an anode connected to the drain of the MOS transistor 35, and a cathode that is grounded. The MOS transistor 36 has a gate connected to the output terminal of the operational amplifier 30, a source connected to the external power supply, and a drain connected to one terminal of the resistance element 32. The other terminal of the resistance element 32 is connected to the anodes of the N diodes 41. The cathodes of the diodes 41 are grounded. A connection node between the drain of the MOS transistor 35 and the anode of the diode 40 is connected to the inverting input terminals of the operational amplifiers 30 and 31. A connection node between the drain of the MOS transistor 36 and one terminal of the resistance element 32 is connected to the positive input terminal of the operational amplifier 30.

The MOS transistor 37 has a gate connected to the output terminal of the operational amplifier 30, and a source connected to the external power supply. The MOS transistor 38 has a gate connected to the output terminal of the operational amplifier 31, and a source connected to the external power supply. The drains of the MOS transistors 37 and 38 are connected to a common node, and this common connection node is connected to one terminal of the resistance element 33. The other terminal of the resistance element 33 is grounded. The MOS transistor 39 has a gate connected to the output terminal of the operational amplifier 31, a source connected to the external power supply, and a drain connected to one terminal of the resistance element 34. The other terminal of the resistance element 34 is grounded. A connection node between the drain of the MOS transistor 39 and one terminal of the resistance element 34 is connected to the positive input terminal of the operational amplifier 31. The voltage at a connection node between the drains of the MOS transistors 37 and 38 and one terminal of the resistance element 33 is output as the output voltage Vref2 of the second BGR circuit 15.

In the above arrangement, the second BGR circuit 15 operates by using the external power supply as the power supply voltage (the source voltage of the MOS transistors 35 to 39), and outputs reference voltage Vref2. Also, the second BGR circuit 15 operates in response to signal Trig3 output from the boosting power supply circuit 12. That is, when signal Trig3 is generated, the second BGR circuit 15 receives the signal and stops operating. More specifically, the second BGR circuit 15 operates and outputs reference voltage Vref2 in a period during which signal Trig3 is negated, and stops operating in a period during which signal Trig3 is asserted. Accordingly, the external power supply is provided to the second BGR circuit 15 when signal Trig3 is negated, and supply of the external power stops when signal Trig3 is asserted.

Letting R4 to R6 be the resistances of the resistance elements 32 to 34 and Vf2 be the voltage drop in the diode 40, reference voltage Vref2 output from the second BGR circuit 15 is represented by $$Vref2=(R5/R6)\cdot(Vf2+(R6/R4)\cdot VT\cdot \ln(N)) \qquad (2)$$

Equation (2) shows that it is possible to change not only the temperature characteristic (dVref2/dT) of Vref2 but also the value itself of Vref2 by changing the resistances R4 to R6 of the resistance elements 32 to 34. That is, the second BGR circuit 15 is a level variable bandgap reference circuit that can operate even when the external power supply drops, by decreasing the value of Vref2 when the external power supply drops.

Figure 4:
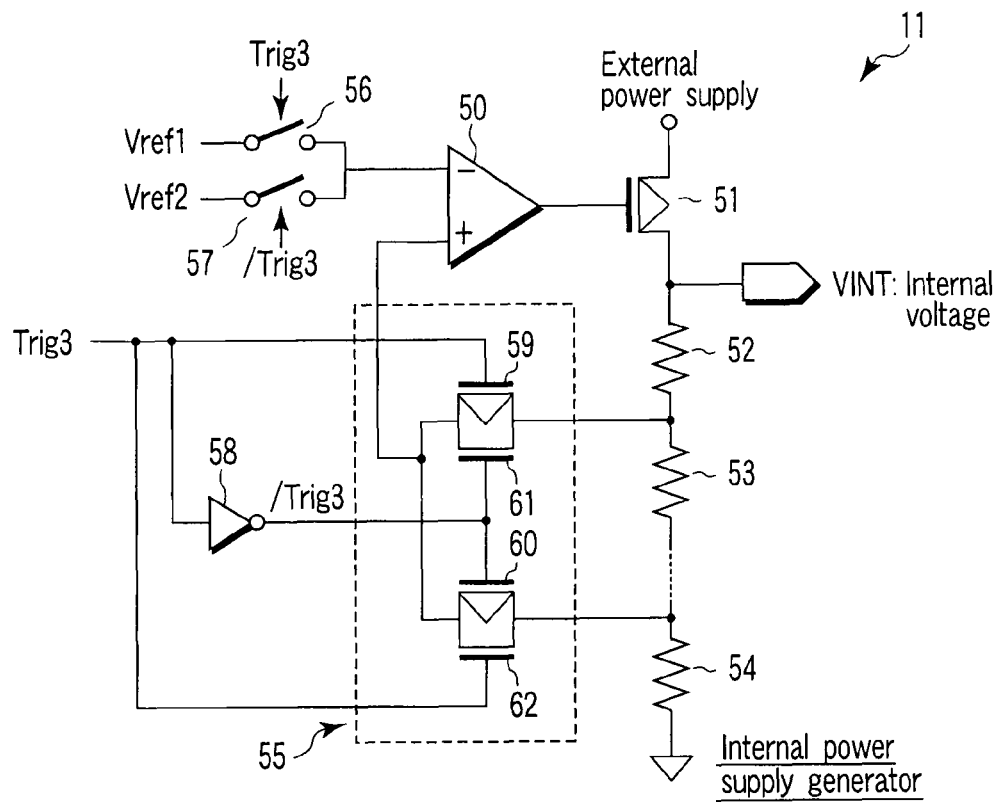
FIG. 4 is a circuit diagram of an internal power supply generator of the semiconductor device according to the first embodiment of the present invention.

The arrangement of the internal power supply generator 11 will be explained below with reference to FIG. 4. FIG. 4 is a circuit diagram of the internal power supply generator 11. As shown in FIG. 4, the internal power supply generator 11 comprises an operational amplifier 50, a p-channel MOS transistor 51, resistance elements 52 to 54, switches 55 to 57, and an inverter 58. The resistance element 54 may also be a series connection of a plurality of resistance elements.

The MOS transistor 51 has a gate connected to the output terminal of the operational amplifier 50, a source to which the external voltage is applied, and a drain connected to one terminal of the resistance element 52. That is, the internal power supply generator 11 operates by using the external power supply voltage as the power supply voltage, and generates a voltage having a desired value by referring to reference voltage Vref1 or Vref2. The other terminal of the resistance element 52 is connected to one terminal of the resistance element 53, and the other terminal of the resistance element 53 is connected to one terminal of the resistance element 54. The other terminal of the resistance element 54 is grounded. The inverter 58 inverts signal Trig3 output from the boosting power supply circuit 12, thereby obtaining a signal /Trig3.

The switch 55 includes p-channel MOS transistors 59 and 60, and n-channel MOS transistors 61 and 62. One end of each of the current paths of the MOS transistors 59 and 61 is connected to a common node, and this common connection node is connected to a connection node between the other terminal of the resistance element 52 and one terminal of the resistance element 53. The other end of each of the current paths of the MOS transistors 59 and 61 is also connected to a common node, and this common connection node is connected to the positive input terminal (+) of the operational amplifier 50. The gate of the MOS transistor 59 receives signal Trig3, and the gate of the MOS transistor 61 receives signal /Trig3 output from the inverter 58.

One end of each of the current paths of the MOS transistors 60 and 62 is connected to a common node, and this common connection node is connected to a connection node between the other terminal of the resistance element 53 and one terminal of the resistance element 54. The other end of each of the current paths of the MOS transistors 60 and 62 is also connected to a common node, and this common connection node is connected to the positive input terminal of the operational amplifier 50. The gate of the MOS transistor 62 receives signal Trig3, and the gate of the MOS transistor 60 receives signal /Trig3 output from the inverter 58.

When signal Trig3 is asserted (high), the switch 56 applies reference voltage Vref1 to the inverting input terminal (−) of the operational amplifier 50.

When signal Trig3 is asserted (high), i.e., when signal Trig3 is negated (low), the switch 57 applies reference voltage Vref2 to the inverting input terminal of the operational amplifier 50.

In the above arrangement, internal voltage VINT=Vref1×((R52+R53+R54)/R54)) when signal Trig3 is asserted, and internal voltage VINT=Vref2×((R52+R53+R54)/(R53+R54)) when signal Trig3 is negated. Note that R52 to R54 denote the resistances of the resistance elements 52 to 54.

In this case, these resistances are set such that Vref1/Vref2=R54/(R53+R54). Note that the internal power supply generator 11 starts operating when signal Trig1 is asserted, and stops operating when signal Trig1 is negated. Therefore, the power supply voltage is applied to the source of the MOS transistor 51 when signal Trig1 is asserted, and application of the power supply voltage stops when signal Trig1 is negated.

The boosting power supply circuit 12 will be explained below. The boosting power supply circuit 12 has a charge pump circuit, and obtains the boosted voltage VPP by referring to reference voltage Vref1 or Vref2. The boosting power supply circuit 12 starts operating when signal Trig2 is asserted (high). Similar to the internal power supply generator 11, the boosting power supply circuit 12 uses reference voltage Vref2 in the period during which signal Trig3 is negated, and uses reference voltage Vref1 in the period during which signal Trig3 is asserted.

Figure 5:
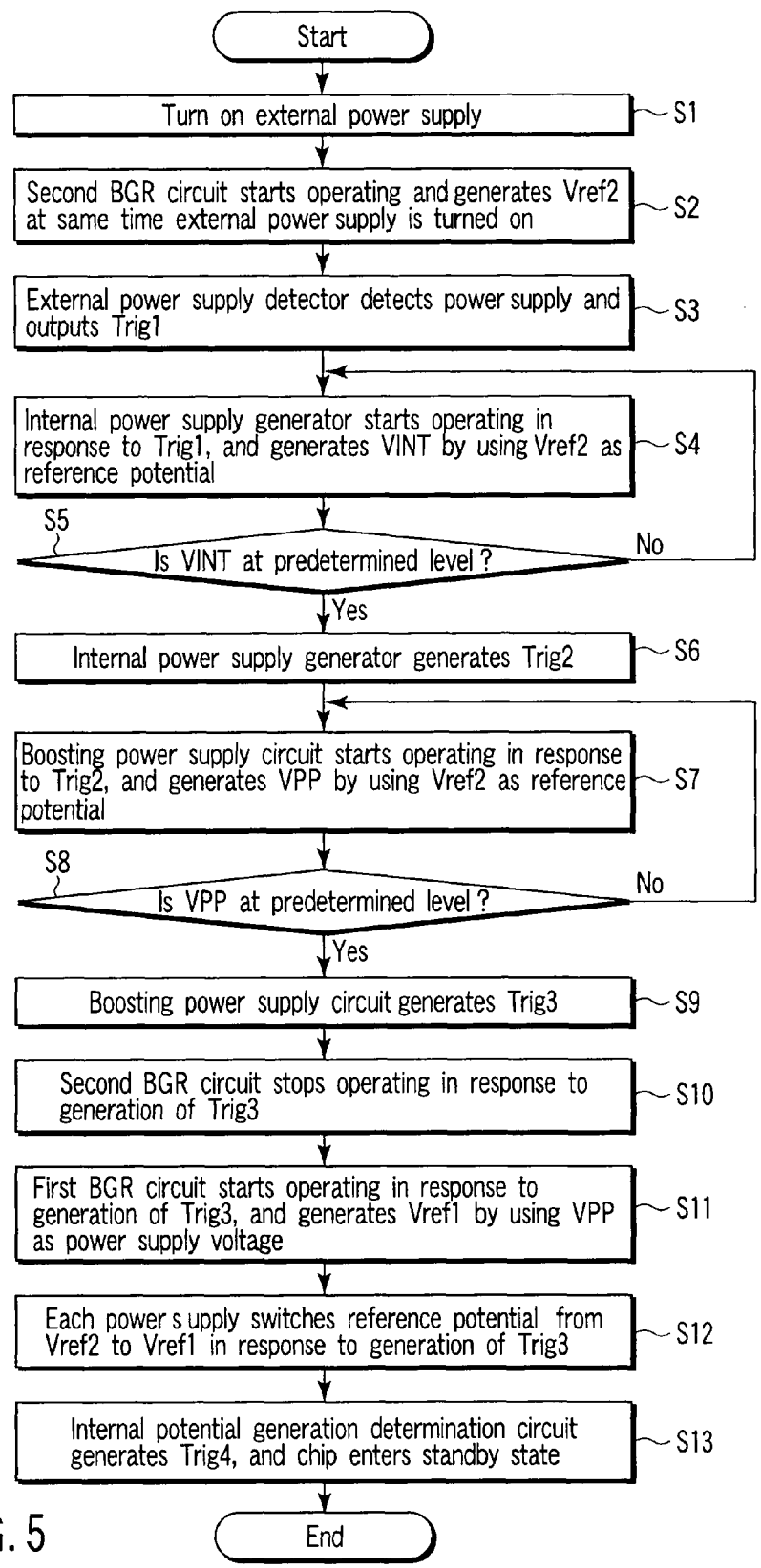
FIG. 5 is a flowchart showing the operation of the semiconductor device according to the first embodiment of the present invention.
Figure 6:
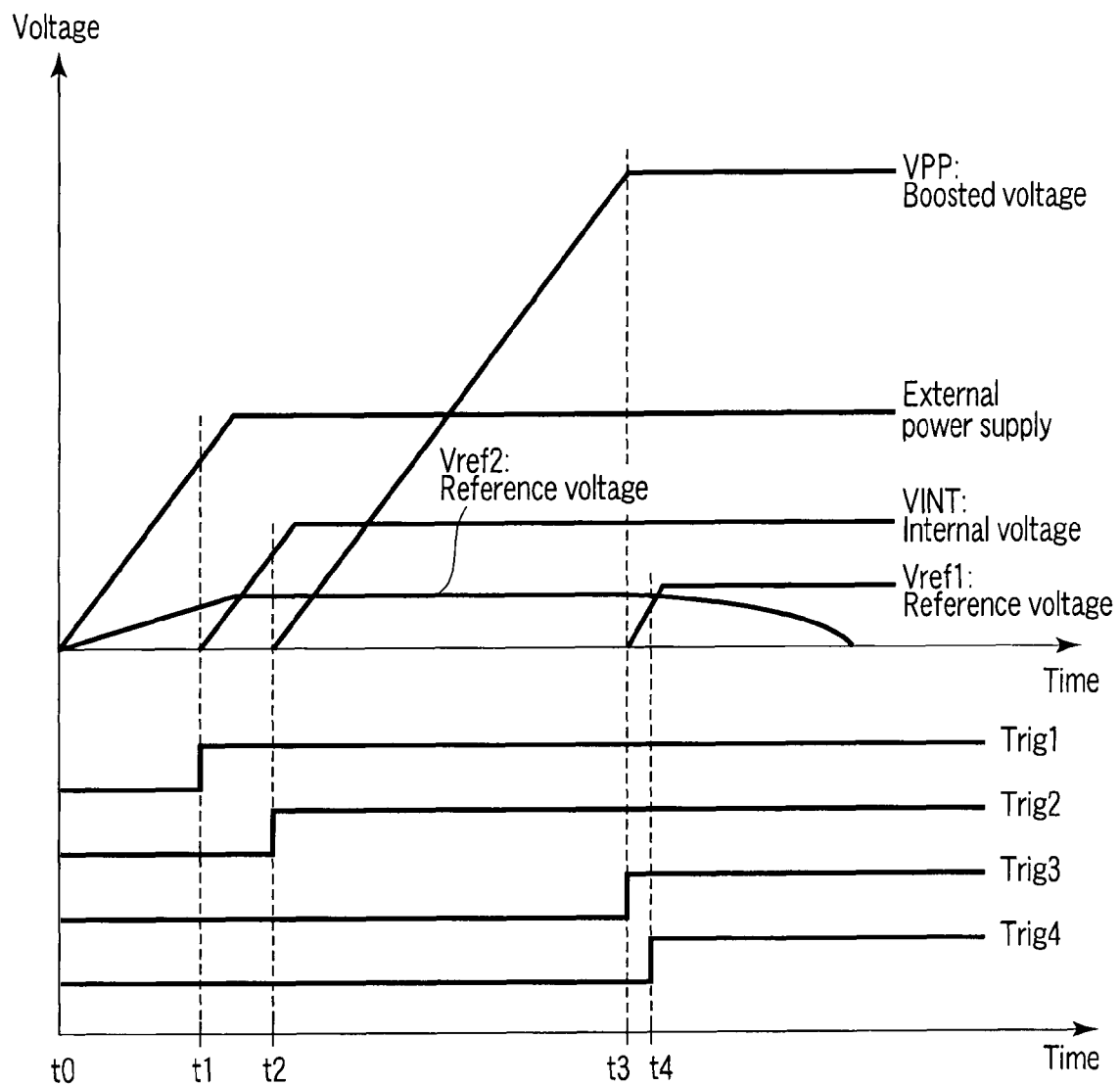
FIG. 6 is a timing chart showing various voltages and signals in the semiconductor device according to the first embodiment of the present invention.

The semiconductor device having the above arrangement will be explained below with reference to FIGS. 5 and 6. FIG. 5 is a flowchart showing the operation sequence of the semiconductor device 1. FIG. 6 is a timing chart showing the external power supply, internal voltage VINT, boosted voltage VPP, reference voltages Vref1 and Vref2, and signals Trig1 to Trig4.

First, assume that the external power is supplied to the semiconductor device 1 at time t0 (step S1). At this time, all signals Trig1 to Trig4 are negated (low). When the external power is supplied, the second BGR circuit 15 starts operating and generates reference voltage Vref2 (step S2). On the other hand, the first BGR circuit 14 is not in operation since signal Trig3 is negated.

When the external power supply has reached a predetermined voltage (time t1), the external power supply detector 10 detects the power supply, and outputs signal Trig1 (high) (step S3). Since signal Trig1 is asserted, the internal power supply generator 11 starts operating, and generates the internal voltage VINT by using reference voltage Vref2 (step S4). The operation of the internal power supply generator 11 in this state will be explained below with reference to FIG. 4.

Referring to FIG. 4, the switch 57 applies reference voltage Vref2 to the inverting input terminal of the operational amplifier 50 because signal Trig3 is low. In the switch 55, the MOS transistors 59 and 61 are turned on, and the MOS transistors 60 and 62 are turned off. Accordingly, the total voltage drop in the resistance elements 53 and 54 is set equal to reference voltage Vref2. As a consequence, the internal voltage VINT is Vref2×((R52+R53+R54)/(R53+R54)).

When the internal voltage VINT has reached a predetermined value (at time t2, YES in step S5), the internal power supply generator 11 generates signal Trig2 (step S6). Since signal Trig2 is asserted, the boosting power supply circuit 12 starts operating, and generates the boosted voltage VPP by referring to reference voltage Vref2 (step S7).

When the boosted voltage VPP has reached a predetermined value (at time t3, YES in step S8), the boosted power supply circuit 12 generates signal Trig3 (step S9). Since signal Trig3 is asserted, the second BGR circuit 15 stops operating (step S10), and the first BGR circuit 14 starts operating instead (step S11). The first BGR circuit 14 operates by using the boosted voltage VPP output from the boosting power supply circuit 12 as the power supply voltage, and output reference voltage Vref1.

In addition, since signal Trig3 is asserted at time t3, the internal power supply generator 11 and boosting power supply circuit 12 switch the reference voltage from Vref2 to Vref1 (step S12). The operation of the internal power supply generator 11 in this state will be explained below with reference to FIG. 4.

Referring to FIG. 4, the switch 56 applies reference voltage Vref1 to the inverting input terminal of the operational amplifier 50 because signal Trig3 is high. In the switch 55, the MOS transistors 59 and 61 are turned off, and the MOS transistors 60 and 62 are turned on. Accordingly, the voltage drop in the resistance element 54 is set equal to reference voltage Vref1. As a consequence, the internal voltage VINT is Vref1× ((R52+R53+R54)/(R54)).

Also, the boosting power supply circuit 12 applies reference voltage Vref1 to the charge pump circuit, and generates the boosted voltage VPP by referring to reference voltage Vref1.

Since the boosted voltage VPP and reference voltage Vref1 are generated, the voltage generation determination circuit 13 generates signal Trig4. Signal Trig4 means that all the internal power supplies in the semiconductor device 1 have reached a predetermined set level. Consequently, the semiconductor device 1 enters a standby state, and can operate in accordance with externally supplied instructions.

As described above, the semiconductor device according to the first embodiment of the present invention achieves effect (1) below.

(1) An accurate voltage can be supplied even when the power supply voltage has dropped (No. 1).

The arrangement according to this embodiment can accurately generate the internal voltage even when the external power supply has dropped to such an extent that the first BGR circuit 14 cannot normally operate. This effect will be explained in detail below.

Conventionally, a semiconductor device uses a bandgap reference circuit (BGR circuit) as a reference voltage generator. As described in BACKGROUND OF THE INVENTION, the BGR circuit can generally output about a constant voltage (Vref=1.25 V) regardless of the temperature, process variation, and power supply voltage. Accordingly, internal voltages can be accurately generated by using the voltage Vref generated by the BGR circuit as a reference voltage. On the other hand, if the voltage Vref varies, all the internal voltages generated by using the voltage Vref as a reference voltage vary. For example, when the voltage Vref is 1.25 V and the boosted voltage VPP generated by using the voltage Vref as a reference voltage is 3.2 V, an internal circuit generates VPP by increasing Vref by 2.56 times. Therefore, the variation in Vref is also increased by 2.56 times. As a consequence, when the variation in Vref increases the variation in VPP, a total OFF current Ioff (an electric current flowing when a transistor is OFF) component of the semiconductor device also varies. This increases the standby current, and makes it difficult to reduce the power consumption of the semiconductor device. Also, the internal potential is desirably fixed to the set potential without any variation from the viewpoint of the speed margin as well. Therefore, decreasing the variation in voltage Vref generated by the BGR circuit is very important to increase the yield of the semiconductor device (from the viewpoints of the power consumption and operating speed).

In this point, a conventional BGR circuit (to be simply referred to as a BGR circuit hereinafter) incapable of varying the level and a level variable bandgap reference circuit (to be referred to as a level variable BGR circuit hereinafter) have the following merits and demerits.

The voltage Vref of the BGR circuit is fixed to 1.25 V when Vref does not change with the temperature (dVref/dT=0), and this value cannot be adjusted. When the power supply voltage of the BGR circuit drops, therefore, the BGR circuit becomes unable to output the desired voltage Vref because a Vccmin (a minimum voltage of the external voltage) operation margin of the BGR circuit itself is insufficient. The Vccmin operation margin indicates the degree of a minimum value of the external voltage at which the BGR circuit can generate a desired voltage. That is, this operation margin decreases as the power supply voltage drops, and becomes zero at a certain point, thereby making a normal operation impossible. This problem of the Vccmin operation margin is accelerated especially in a low-temperature operation or when the threshold voltage of a MOS transistor is high. Accordingly, a BGR circuit corresponding to a low power supply voltage is necessary to implement a semiconductor device meeting the above conditions.

The level variable BGR circuit is a BGR circuit corresponding to a low power supply voltage. As the external power supply drops, the level variable BGR circuit decreases the value of the output voltage Vref accordingly, thereby ensuring the Vccmin operation margin. However, the number of semiconductor elements forming the level variable BGR circuit is much larger than that of the BGR circuit incapable of varying the level. In addition, a semiconductor element that generates the reference voltage of internal voltages is particularly required to perform a high-accuracy operation. Therefore, a large number of semiconductor elements directly increase the process variation.

The process variation will be explained below. In both the BGR circuit and level variable BGR circuit, the voltage Vref is ideally a constant value having no fluctuation in every temperature range as described above. In practice, however, the voltage Vref has positive and negative slopes with respect to the temperature, and has a finite variation. This variation decreases the yield of semiconductor devices.

Theoretically, the BGR circuit and level variable BGR circuit can cancel the influence of the process variation. However, this process variation is a process variation on the surface of a wafer or between lots. Accordingly, this is based on the assumption that the threshold voltages of a pair of transistors arranged adjacent to each other are exactly the same as in, e.g., a current mirror circuit. Recently, however, as micropatterning of semiconductor elements advances, even a pair of transistors having the same shape and arranged adjacent to each other have a variation in, e.g., threshold voltage. This variation between a pair of transistors increases the variation in voltage Vref especially in the level variable BGR circuit having a number of semiconductor elements required to perform a high-accuracy operation.

This variation in threshold voltage between a pair of transistors is presumably proportional to $A/\sqrt{\text{gate area}}$ where A is a constant determined by the process. That is, the smaller the size (gate area) of a MOS transistor, the larger the variation in threshold voltage between a pair of transistors. Therefore, a transistor having a large gate area must be used to suppress the variation in voltage Vref in the level variable BGR circuit. It is also necessary to increase circuits for adjusting the variation in Vref. Both the necessities increase the layout area of a semiconductor device, increase the chip size, and increase the cost. This is particularly significant in the level variable BGR circuit having a large number of constituent elements.

That is, the level variable BGR circuit has the merit that the Vccmin operation margin can be assured because the value of the output voltage Vref can be changed in accordance with the power supply voltage. However, the level variable BGR circuit has the demerit that the variation in Vref increases because the number of semiconductor elements is large, and this increases the variation in internal voltage generated by using Vref as a reference voltage.

On the other hand, the BGR circuit having a constant level has a small Vccmin operation margin, and hence becomes unable to obtain a desired Vref as the external power supply becomes a low voltage. Consequently, the internal voltage also becomes lower than the desired level. However, the BGR circuit has the merit that the variation in Vref is small.

Accordingly, this embodiment uses the merits of both the BGR circuit having a constant level and the level variable BGR circuit by combining them, thereby obtaining the voltage Vref corresponding to the power supply voltage drop and having a small variation. In this embodiment, the first BGR circuit 14 is the BGR circuit having a constant level, and the second BGR circuit 15 is the level variable BGR circuit.

In this embodiment, immediately after the external power supply is turned on (this state will be referred to as "at the time of power-on" hereinafter), the second BGR circuit 15 operates by using the external power supply voltage as the power supply voltage, and generates the voltage Vref2. The second BGR circuit 15 is the level variable BGR circuit and hence can operate even when the external power supply is low. Also, at the time of power-on, voltages such as the internal voltage VINT and boosted voltage VPP generated by using the voltage Vref2 as a reference voltage are not actually used in the operation of the semiconductor device. Accordingly, even if these voltages vary at the time of power-on, particularly no problem arises in operation.

When the boosting power supply circuit 12 generates the boosted voltage VPP and signal Trig3, the second BGR circuit 15 stops operating, and the first BGR circuit 14 starts operating by using the boosted voltage VPP as the power supply voltage. As described above, the first BGR circuit 14 has a Vccmin operation margin smaller than that of the second BGR circuit 15. When signal Trig3 is output, however, the boosted voltage VPP has already reached the desired value. That is, the boosted voltage VPP as the power supply voltage of the first BGR circuit 14 is sufficiently high, and the Vccmin margin does not pose a problem, so the first BGR circuit 14 can normally operate. Since the first BGR circuit 14 starts operating, the internal power supply generator 11 and boosting power supply circuit 12 switch the reference voltage from Vref2 to Vref1. That is, the circuits 11 and 12 generate the internal voltage VINT and boosted voltage VPP by using Vref1 having a variation smaller than that of Vref2. Therefore, the internal voltage VINT and boosted voltage VPP having small variations can be obtained by switching the reference voltage to Vref1.

As described above, at the time of power-on, the second BGR circuit 15 is used to make the internal power supply generator 11 and boosting power supply circuit 12 operable even at a low power supply voltage. After that, the first BGR circuit 14 is operated by using the boosted voltage VPP generated by the boosting power supply circuit 12. Accordingly, although the variation in reference voltage (Vref2) is large at the time of power-on, the final variation in reference voltage (Vref1) is small. This makes it possible to produce an accurate voltage even when the power supply voltage drops. Also, since reference voltage Vref2 is used only at the time of power-on, it is unnecessary to well take account of the variation in Vref2. Therefore, the circuit area can be reduced compared to the case that the conventional level variable BGR circuit is used.

Note that this embodiment has explained the case that the boosted voltage VPP is used as the power supply voltage of the first BGR circuit 14. This is so because the boosted voltage is generally higher than the external power supply and hence can increase the operation margin of the first BGR circuit 14. Accordingly, it is also possible to use, e.g., the internal voltage VINT other than the boosted voltage VPP, provided that the value is high enough for the first BGR circuit 14 to operate.

Note also that in the arrangement according to this embodiment, the circuit such as the internal power supply generator 11 that receives reference voltages Vref1 and Vref2 recognizes switching between reference voltages Vref1 and Vref2 by signal Trig3, and also switches the voltage dividing ratios of the resistance elements 52 to 54 by signal Trig3. That is, the receiving circuit switches reference voltages Vref1 and Vref2, and also switches the potential nodes which the positive input terminal of the operational amplifier 50 refers to in the series connection of the resistance elements 52 to 54. This makes it possible to always obtain the internal voltage VINT having the desired value even if there is a difference between reference voltage Vref1 used at the time of power-on and reference voltage Vref2 used after that. Note that the above embodiment has explained only the internal power supply generator 11, but the same arrangement is also applicable to the boosting power supply circuit 12.

Second Embodiment

Figure 7:
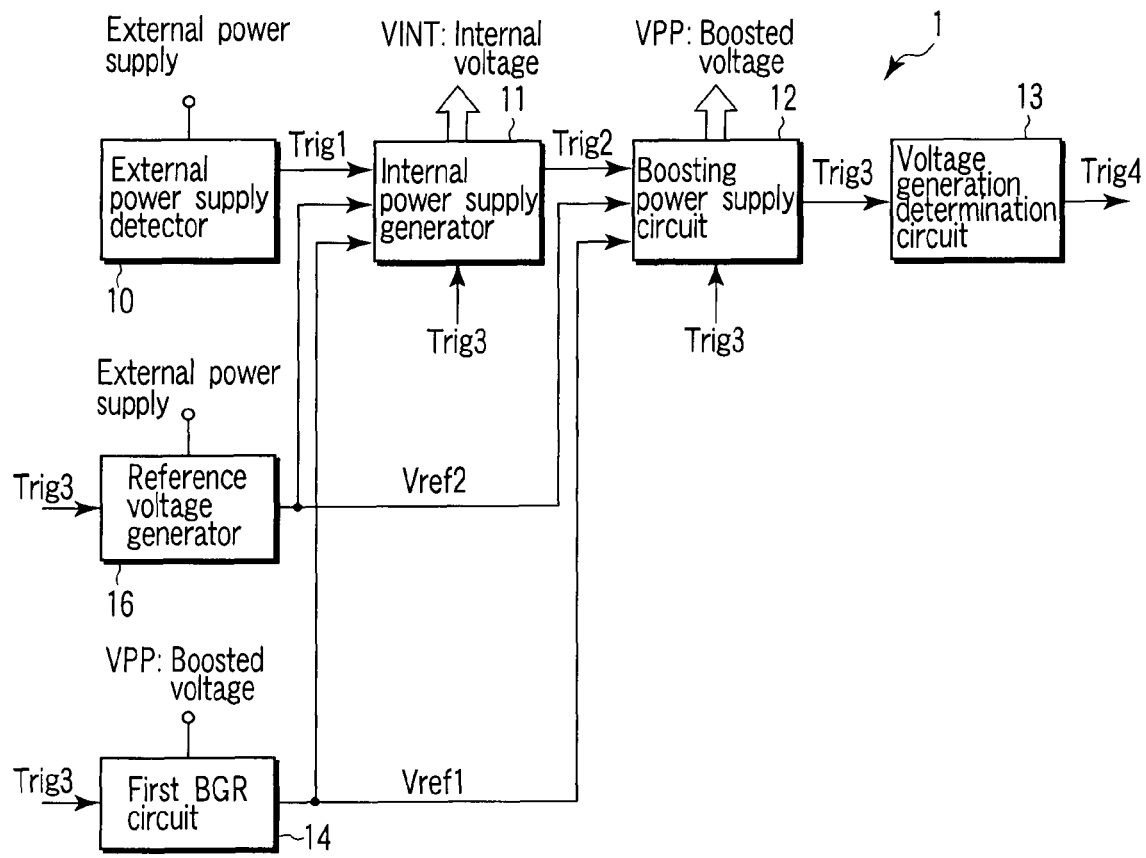
FIG. 7 is a block diagram of a semiconductor device according to the second embodiment of the present invention.

A semiconductor device according to the second embodiment of the present invention will be explained below. This embodiment uses a voltage generator other than a bandgap reference circuit, instead of the second BGR circuit 15 in the first embodiment described above. FIG. 7 is a block diagram of the semiconductor device according to this embodiment.

Figure 8:
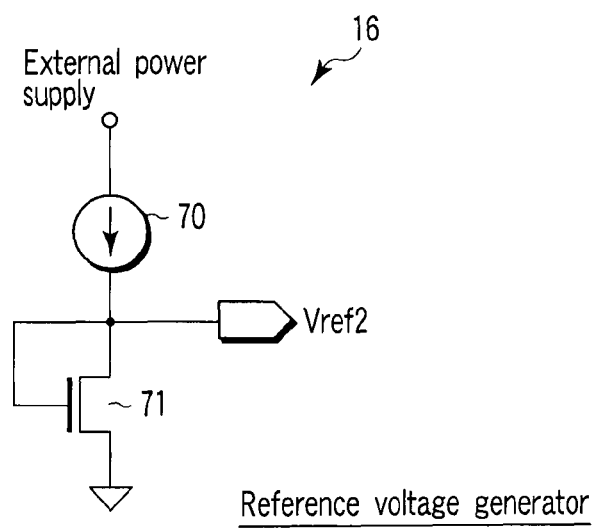
FIG. 8 is a circuit diagram of a reference voltage generator of the semiconductor device according to the second embodiment of the present invention.
Figure 9:
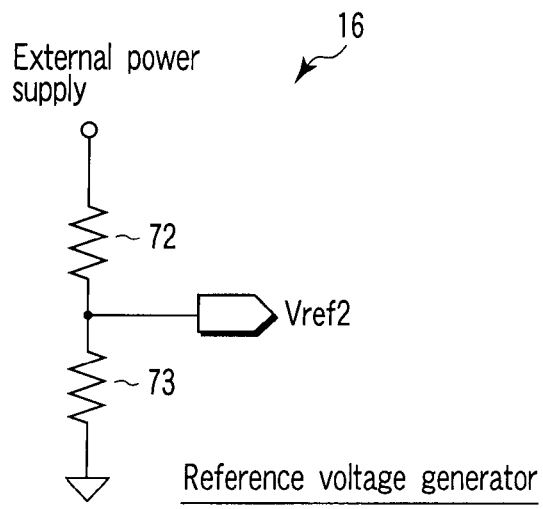
FIG. 9 is a circuit diagram of the reference voltage generator of the semiconductor device according to the second embodiment of the present invention.

As shown in FIG. 7, a semiconductor device 1 is obtained by replacing the second BGR circuit 15 with a reference voltage generator 16 in the arrangement shown in FIG. 1 explained in the first embodiment. The reference voltage generator 16 is a voltage generator having an arrangement other than a bandgap reference circuit. Examples of the arrangement of the reference voltage generator 16 will be explained below with reference to FIGS. 8 and 9. FIGS. 8 and 9 are circuit diagrams of the reference voltage generator 16.

First, as shown in FIG. 8, the reference voltage generator 16 comprises a current source circuit 70 and n-channel MOS transistor 71. The current source circuit 70 outputs a constant current from the output node by using an external power supply as the power supply voltage. The MOS transistor 71 has a drain and gate connected to the output node of the current source circuit 70, and a source that is grounded. That is, the MOS transistor 71 functions as a diode. The potential at a connection node between the output node of the current source circuit 70 and the drain and gate of the MOS transistor 71 is output as a reference voltage Vref2.

Another example will be explained with reference to FIG. 9. As shown in FIG. 9, the reference voltage generator 16 comprises two series-connected resistance elements 72 and 73. The resistance element 72 has one terminal connected to an external power supply and the other terminal connected to one terminal of the resistance element 73, and the other terminal of the resistance element 73 is grounded. The potential at a connection node between the other terminal of the resistance element 72 and one terminal of the resistance element 73 is output as reference voltage Vref2.

The rest of the arrangement and the operation are the same as in the first embodiment, so a repetitive explanation will be omitted.

As described above, the semiconductor device according to the second embodiment of the present invention achieves effects (2) and (3) below.

(2) An accurate voltage can be applied even when the power supply voltage has dropped (No. 2).

As explained in effect (1) of the first embodiment, the second BGR circuit 15 used at the time of power-on need only generate the voltage Vref2 that is enough for a boosting power supply circuit 12 to generate a predetermined boosted voltage (a potential higher than the external power supply). In addition, particularly no problem arises even if Vref2 has a slight variation. Accordingly, the second BGR circuit 15 need not be a bandgap reference circuit, and the same effect as (1) can be obtained even when the reference voltage generator 16 as in this embodiment is used.

(3) The semiconductor device can be downsized (No. 1).

In the arrangement according to this embodiment, the reference voltage generator 16 need only output a voltage that allows the boosting power supply circuit 12 to operate. This makes it possible to use an arrangement, such as the arrangement shown in FIG. 8 or 9, in which the number of semiconductor elements is smaller than that in the second BGR circuit 15. Therefore, the semiconductor device can be downsized compared to the first embodiment.

Third Embodiment

Figure 10:
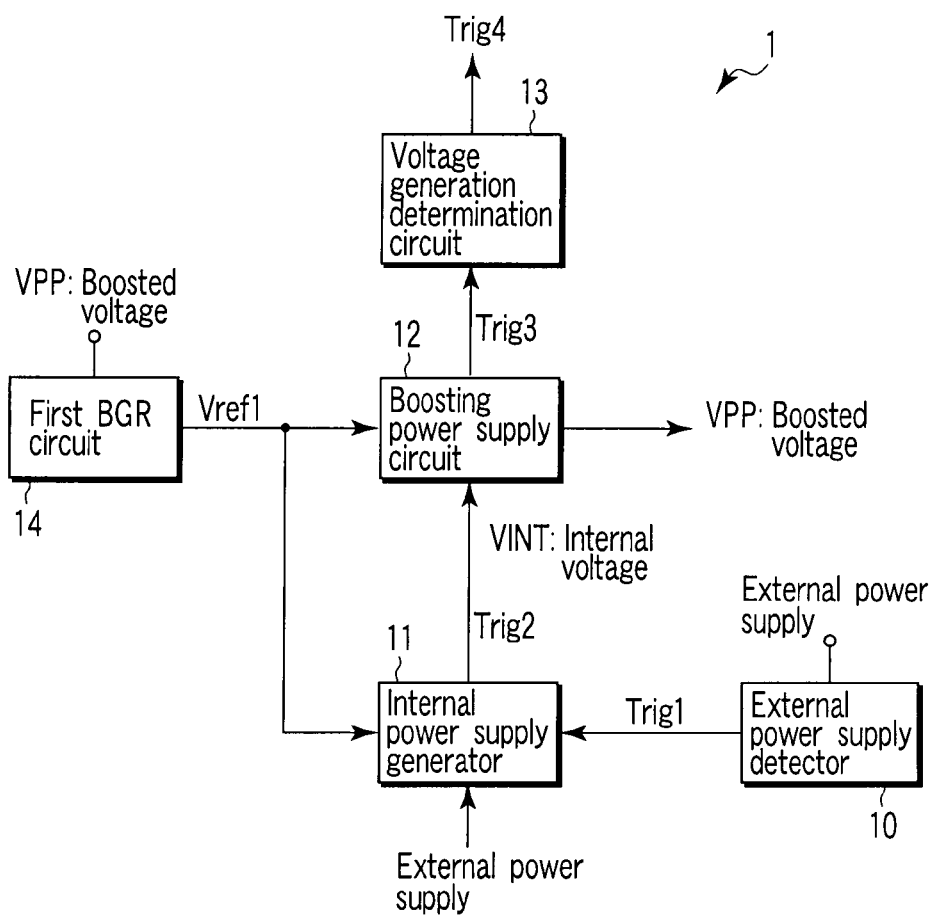
FIG. 10 is a block diagram of a semiconductor device according to the third embodiment of the present invention.

A semiconductor device according to the third embodiment of the present invention will be explained below. This embodiment is obtained by omitting the second BGR circuit 15 from the first embodiment described above. FIG. 10 is a block diagram of the semiconductor device according to this embodiment.

As shown in FIG. 10, a semiconductor device 1 is obtained by omitting the second BGR circuit 15, and using a voltage Vref1 output from a first BGR circuit 14 as the reference voltage of an internal power supply generator 11 and boosting power supply circuit 12 even at the time of power-on, in the arrangement shown in FIG. 1 explained in the first embodiment.

The internal power supply generator 11 uses an external power supply voltage as the power supply voltage. When reference voltage Vref1 is insufficient for the internal power supply generator 11 to normally operate, the internal power supply generator 11 outputs a voltage by dropping the external power supply as an internal voltage VINT. When the internal voltage VINT has reached a predetermined value, the internal power supply generator 11 generates a signal Trig2.

The boosting power supply circuit 12 uses the internal voltage VINT as the power supply voltage. When reference voltage Vref1 is insufficient for the boosting power supply circuit 12 to normally operate, the boosting power supply circuit 12 directly outputs the internal voltage VINT as a boosted voltage VPP. When the boosted voltage VPP has reached a predetermined value, the boosting power supply circuit 12 generates a signal Trig3.

A voltage generation determination circuit 13 generates a signal Trig4 upon receiving signal Trig3 from the boosting power supply circuit 12, thereby setting the semiconductor device 1 in a standby state.

Figure 11:
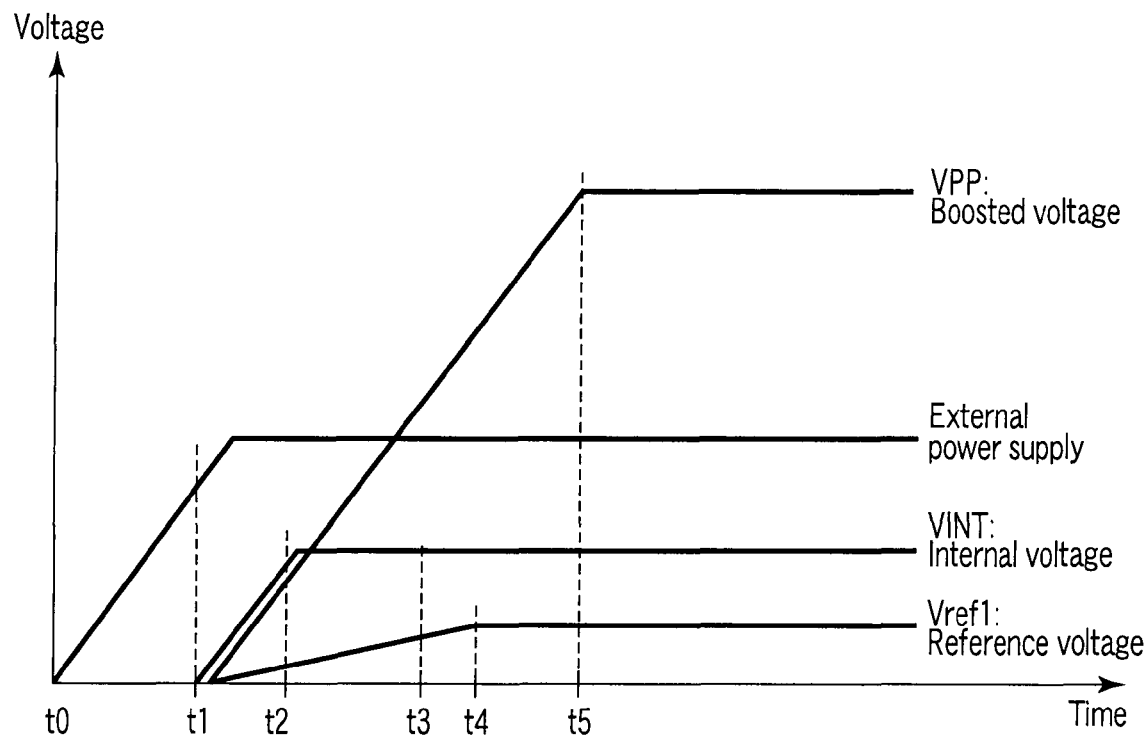
FIG. 11 is a timing chart showing various voltages and signals in the semiconductor device according to the third embodiment of the present invention.

The operation of the arrangement according to this embodiment will be explained below with reference to FIG. 11. FIG. 11 is a timing chart showing the external power supply, internal voltage VINT, boosted voltage VPP, and reference voltage Vref1.

As shown in FIG. 11, assume that the external power is supplied to the semiconductor device 1 at time t0. When the external power supply has reached a predetermined value (time t1), an external power supply detector 10 outputs a signal Trig1. In response to signal Trig1, the internal power supply generator 11 starts operating at time t1. When the internal voltage VINT generated by the internal power supply generator 11 has reached a predetermined value (time t2), the internal power supply generator 11 outputs signal Trig2. Also, during the period from time t1 to time t2, the boosting power supply circuit 12 directly outputs internal voltage VINT supplied from the internal power supply generator 11 as the boosted voltage VPP. Upon receiving the boosted voltage VPP, the first BGR circuit 14 generates reference voltage Vref1.

At time t2, the boosting power supply circuit 12 starts operating in response to signal Trig2. Assume that the boosting power supply circuit 12 can generate the boosted voltage VPP higher than the external power supply by using reference voltage Vref1 that has not reached a predetermined value. In this case, the first BGR circuit 14 reaches a normally operable state at a certain value of the boosted voltage VPP (time t3). Consequently, the first BGR circuit 14 can set the value of reference voltage Vref1 at the original set voltage. Also, reference voltage Vref1 allows the boosted voltage VPP to reach a predetermined set value at time t5. As a consequence, the boosting power supply circuit 12 outputs signal Trig3. The voltage generation determination circuit 13 outputs signal Trig4 by receiving signal Trig3, thereby setting the semiconductor device 1 in the standby state.

As described above, the semiconductor device according to the third embodiment of the present invention achieves effects (4) and (5) below.

(4) An accurate voltage can be produced even when the power supply voltage has dropped (No. 3).

As explained in effect (1) of the first embodiment, the second BGR circuit 15 used at the time of power-on need only generate a voltage Vref2 that allows the boosting power supply circuit 12 to generate a certain predetermined boosted voltage (a potential higher than the external power supply). Therefore, even when the first BGR circuit 14 is unable to normally operate and output reference voltage Vref1 as a target because the external power supply has dropped, if the boosting power supply circuit 12 is able to output the boosted voltage VPP higher than the external power supply, the first BGR circuit 14 can be used from the time of power-on. When the boosted voltage VPP output from the boosting power supply circuit 12 becomes higher than the external power supply, the first BGR circuit 14 can output reference voltage Vref1 as the original set value. Accordingly, this embodiment also achieves the same effect as (1) explained in the first embodiment.

(5) The semiconductor device can be downsized (No. 2).

The arrangement according to this embodiment requires neither the second BGR circuit 15 explained in the first embodiment, nor the reference voltage generator 16 explained in the second embodiment. Therefore, the semiconductor device can be downsized compared to the first and second embodiments.

Fourth Embodiment

Figure 12:
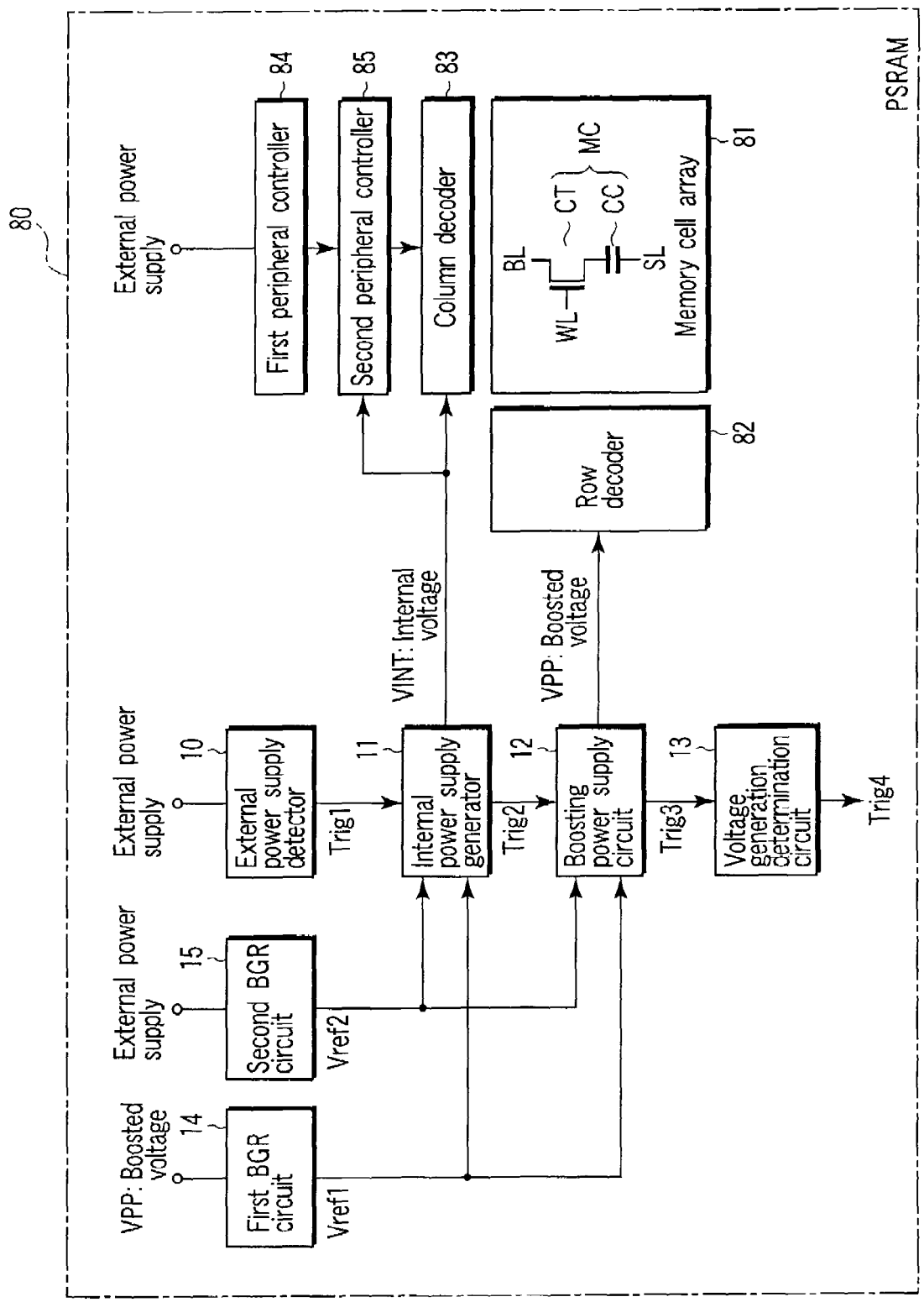
FIG. 12 is a block diagram of a semiconductor device according to the fourth embodiment of the present invention.

A semiconductor device according to the fourth embodiment of the present invention will be explained below. This embodiment applies the first embodiment to a semiconductor memory device. FIG. 12 is a block diagram of a pseudo-SRAM (to be referred to as a PSRAM hereinafter) according to this embodiment.

As shown in FIG. 12, a PSRAM 80 comprises an external power supply detector 10, an internal power supply generator 11, a boosting power supply circuit 12, a voltage generation determination circuit 13, first and second BGR circuits 14 and 15, a memory cell array 81, a row decoder 82, a column decoder 83, a first peripheral controller 84, and a second peripheral controller 85. The arrangements and operations of the external power supply detector 10, internal power supply generator 11, boosting power supply circuit 12, voltage generation determination circuit 13, and first and second BGR circuits 14 and 15 are the same as explained in the first embodiment, so a repetitive explanation will be omitted.

The memory cell array 81 includes a plurality of memory cells MC arranged in a matrix. Each memory cell MC has a DRAM cell structure, and includes a cell transistor CT and cell capacitor CC. The cell transistor CT has a gate connected to a word line WL, a drain connected to a bit line BL, and a source connected to one electrode of the cell capacitor CC. The other electrode of the cell capacitor CC is connected to a source line.

When writing data in and reading out data from the memory cell MC, the row decoder 82 selects one word line WL and applies a voltage to the selected word line WL. In data write and read, the row decoder 82 applies a boosted voltage VPP (=3.2 V) supplied from the boosting power supply circuit 12 to the selected word line, and 0 V to non-selected word lines.

In data write and read, the column decoder 83 selects one bit line BL and applies a voltage to the selected bit line BL. In data read, the column decoder 83 selects one bit line BL and applies a precharge potential to the selected bit line BL. In data write, the column decoder 83 applies a voltage corresponding to write data to the selected bit line. One of these voltages is an internal voltage VINT supplied from the internal power supply generator 11.

The first peripheral controller 84 operates by using an external power supply as the power supply voltage, and controls the operations of the circuit blocks in the PSRAM 80. The second peripheral controller 85 operates by using the internal voltage VINT as the power supply voltage, and controls the column decoder 83 under the control of the first peripheral controller 84.

As in this embodiment, the arrangement explained in the first embodiment can also be used as a voltage generator of a semiconductor memory device. In particular, the recent spread of mobile apparatuses such as cell phones requires semiconductor memories used in these apparatuses to achieve energy saving, low operating voltages, and wide temperature guarantee ranges. In a trend like this, the various conventionally unseen problems are revealing themselves. One problem is the variation in internal voltage generated inside a semiconductor memory. A semiconductor memory generates an internal voltage by using a reference voltage output from a bandgap reference circuit. By applying the arrangement explained in the first embodiment as the arrangement that outputs the reference voltage, therefore, it is possible to meet the demands for energy saving, low operating voltages, and wide temperature guarantee ranges required of semiconductor memories.

Note that this embodiment has explained the application of the arrangement explained in the first embodiment, but it is of course also possible to apply the arrangement explained in the second or third embodiment to a semiconductor memory, and obtain the same effects as above in this case as well.

Figure 13:
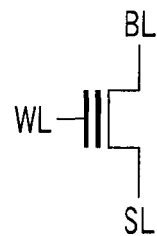
FIG. 13 is a circuit diagram of a memory cell of a semiconductor device according to a modification of the fourth embodiment of the present invention.

Note also that the present invention is extensively applicable to general semiconductor memories as well as a PSRAM. Examples are a DRAM and EEPROM. FIG. 13 is a circuit diagram of a memory cell MC of an EEPROM. As shown in FIG. 13, the memory cell MC is a MOS transistor having a sacked gate that includes a charge storage layer (e.g., a floating gate) formed on a gate insulating film on a semiconductor substrate, and a control gate formed on an intergate insulating film on the charge storage layer. The drains of memory cells MC in the same column are connected together to a single line BL. The control gates of memory cells MC on the same row are connected together to a single word line WL, and the sources of these memory cells are connected together to a source line SL. The present invention is naturally applicable not only to a DRAM, pseudo-SRAM, and EEPROM, but also to a ferroelectric memory, MRAM, and the like.

As described above, in the semiconductor devices according to the first to fourth embodiments of the present invention, the output from a voltage generator such as a boosting circuit that generates an internal voltage by boosting a voltage by referring a certain reference voltage is used as the power supply voltage of the first BGR circuit that generates the reference voltage. Even when an external power supply is a low voltage, therefore, reference voltage Vref1 having the desired value and a small variation can be obtained. This makes it possible to reduce the production cost while ensuring the semiconductor device fabrication yield (e.g., low current consumption and a speed margin).

In the arrangements according to the first and second embodiments, the second BGR circuit 15 and reference voltage generator 16 stop operating when signal Trig3 is asserted. However, the second BGR circuit 15 and reference voltage generator 16 need not always stop operating but may also operate together with the first BGR circuit 14. From the viewpoint of the power consumption, however, it is desirable to stop the second BGR circuit 15 and reference voltage generator 16.

Also, in the first and second embodiments, the internal power supply generator 11 and boosting power supply circuit 12 switch the reference voltage from Vref2 to Vref1 at the same time the first BGR circuit 14 starts operating (signal Trig3 is generated). However, the switching timing need not always be the same as the start of the operation, but may also have a time difference to a certain degree. For example, the reference voltages may also be switched when reference voltage Vref1 has reached a predetermine level after signal Trig3 is generated. Note that when switching the reference voltages, particularly no problem arises because the node that receives the voltages Vref1 and Vref2 is normally a high-impedance node.

In addition, the first and second embodiments have explained the case that as shown in, e.g., FIG. 6, when the boosted voltage VPP has reached a predetermined voltage, signal Trig3 is generated, and the first BGR circuit 14 starts operating. However, the boosted voltage VPP need not always reach the predetermined voltage, and signal Trig3 may also be output when the boosted voltage VPP has reached a voltage sufficient for the first BGR circuit 14 to operate normally (e.g., a value higher than the external power supply).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a boosting power supply circuit which boosts a first voltage to a second voltage higher than an external power supply;
    a first bandgap reference (BGR) circuit which operates upon the second voltage generated by the boosting power supply circuit; and
    a reference voltage generator which operates upon the externally provided external power supply, and generates the first voltage,
    wherein the boosting power supply circuit boosts the first voltage generated by the reference voltage generator to the second voltage.

2. The device according to claim 1, wherein the first BGR circuit generates the first voltage after the second voltage is generated by the boosting power supply circuit, and
    the boosting power supply circuit boosts the first voltage output from the first BGR circuit to the second voltage.

3. The device according to claim 2, wherein the reference voltage generator stops an operation in response to the generation of the second voltage by the boosting power supply circuit.

4. The device according to claim 2, which further comprises an internal power supply generator which generates an internal voltage by using the first voltage as a reference voltage, and
    after the first BGR circuit has operated upon the second voltage, the reference voltage is switched from the first voltage generated by the reference voltage generator to the first voltage generated by the first BGR circuit.

5. The device according to claim 4, wherein the reference voltage is switched at a same time the first BGR circuit operates upon the second voltage.

6. The device according to claim 2, wherein the first BGR circuit generates the first voltage having a constant level.

7. The device according to claim 1, wherein the reference voltage generator generates the first voltage at the same time the external power supply is turned on.

8. The device according to claim 1, wherein the first BGR circuit stops an operation when the external power supply is turned on.

9. The device according to claim 1, wherein
    the boosting power supply circuit uses the first voltage as a reference voltage, and
    after the first BGR circuit has operated upon the second voltage, the reference voltage is switched from the first voltage generated by the reference voltage generator to the first voltage generated by the first BGR circuit.

10. The device according to claim 9, wherein the reference voltage is switched at a same time the first BGR circuit operates upon the second voltage.

* * * * *